(12) United States Patent
Koehler et al.

(10) Patent No.: US 6,864,960 B2
(45) Date of Patent: Mar. 8, 2005

(54) ZOOM SYSTEM FOR AN ILLUMINATION DEVICE

(75) Inventors: Jess Koehler, Oberkochen (DE); Johannes Wangler, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/234,143

(22) Filed: Sep. 5, 2002

(65) Prior Publication Data

US 2003/0090638 A1 May 15, 2003

(30) Foreign Application Priority Data

Sep. 5, 2001 (DE) .......................... 101 44 243

(51) Int. Cl.⁷ .......................... G03B 27/54; G03B 27/42
(52) U.S. Cl. .......................... 355/67; 355/53
(58) Field of Search .............................. 355/53, 55, 67, 355/77; 359/354, 676, 683, 684, 686, 689, 694, 695, 691

(56) References Cited

U.S. PATENT DOCUMENTS

| | | | |
|---|---|---|---|
| 4,851,882 A | * 7/1989 | Takahashi et al. | 355/46 |
| 5,237,367 A | 8/1993 | Kudo | |
| 5,245,384 A | * 9/1993 | Mori | 355/67 |
| 5,379,090 A | 1/1995 | Shiraishi | |
| 5,675,401 A | * 10/1997 | Wangler et al. | 355/67 |
| 5,955,243 A | * 9/1999 | Tanitsu | 430/311 |
| 6,075,653 A | * 6/2000 | Narimatsu et al. | 359/686 |
| 6,249,335 B1 | 6/2001 | Shiraishi et al. | |
| 6,285,443 B1 | * 9/2001 | Wangler et al. | 355/67 |
| 6,307,682 B1 | * 10/2001 | Hoffman et al. | 359/663 |
| 6,563,567 B1 | * 5/2003 | Komatsuda et al. | 355/71 |
| 2001/0001247 A1 | 5/2001 | Finders et al. | |

FOREIGN PATENT DOCUMENTS

| | | |
|---|---|---|
| DE | 44 21 053 A1 | 12/1995 |
| EP | 0 576 297 A1 | 12/1993 |
| EP | 0 687 956 A1 | 12/1995 |
| EP | 0 747 772 A1 | 12/1996 |
| EP | 1 014 196 A2 | 6/2000 |
| EP | 1 211 561 A | 6/2002 |
| EP | 1 235 113 A | 8/2002 |
| JP | 2001-135560 A | 5/2001 |
| WO | WO 01/61411 A1 | 8/2001 |

* cited by examiner

Primary Examiner—Alan Mathews
(74) Attorney, Agent, or Firm—Sughrue Mion, PLLC

(57) ABSTRACT

A zoom system for an illumination device of a microlithographic projection exposure system is configured in the form of a focal-length zoom lens. The lenses of the zoom system define an object plane (6) and an image plane (8) that is a Fourier transform of the object plane. The zoom system is characterized by a large expansion of the illuminated area in the image plane, where expansion factors (D) in excess of four are feasible and are obtained by employing lens groups (33, 36) that are movable over large moving ranges.

65 Claims, 3 Drawing Sheets

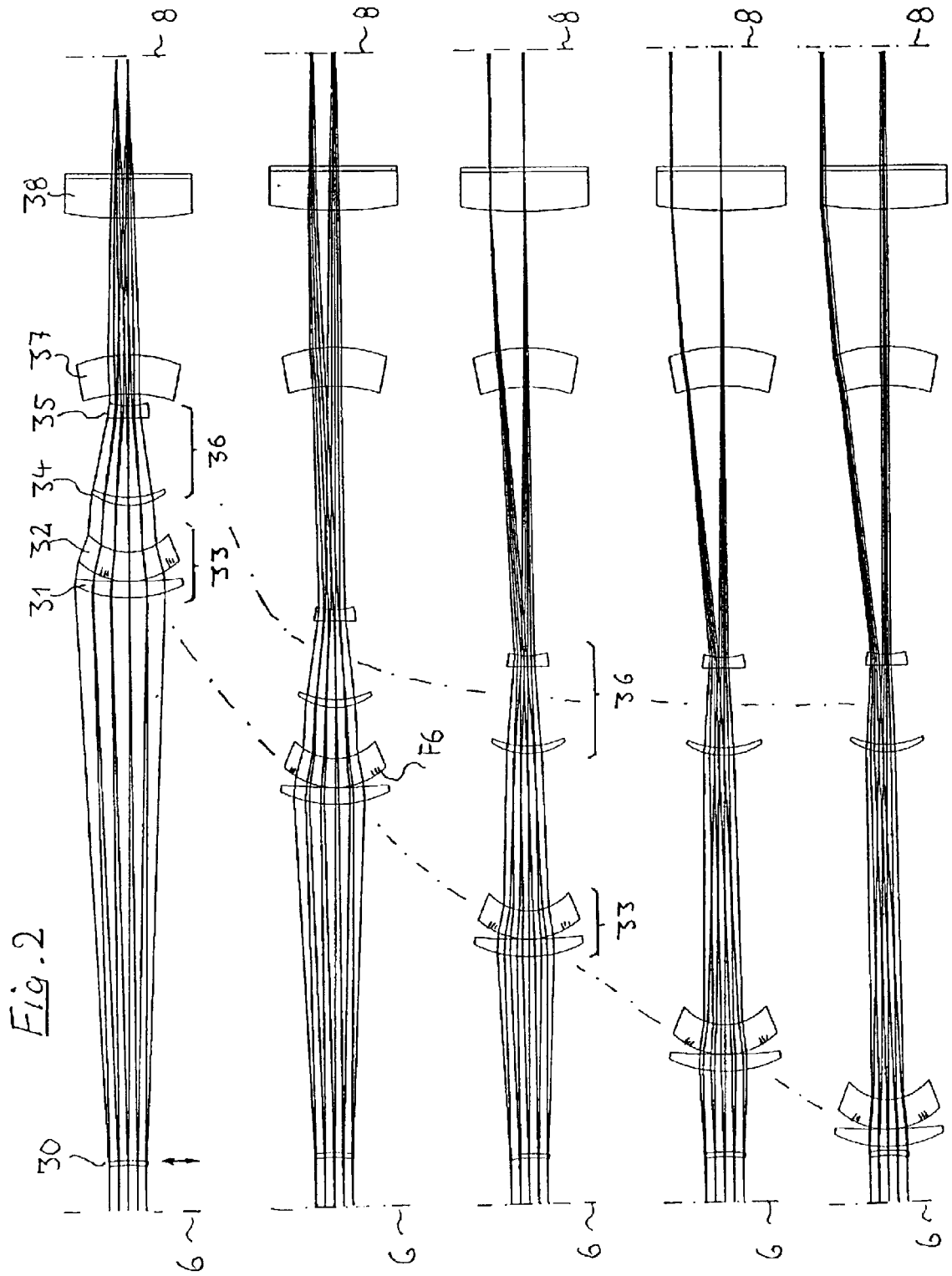

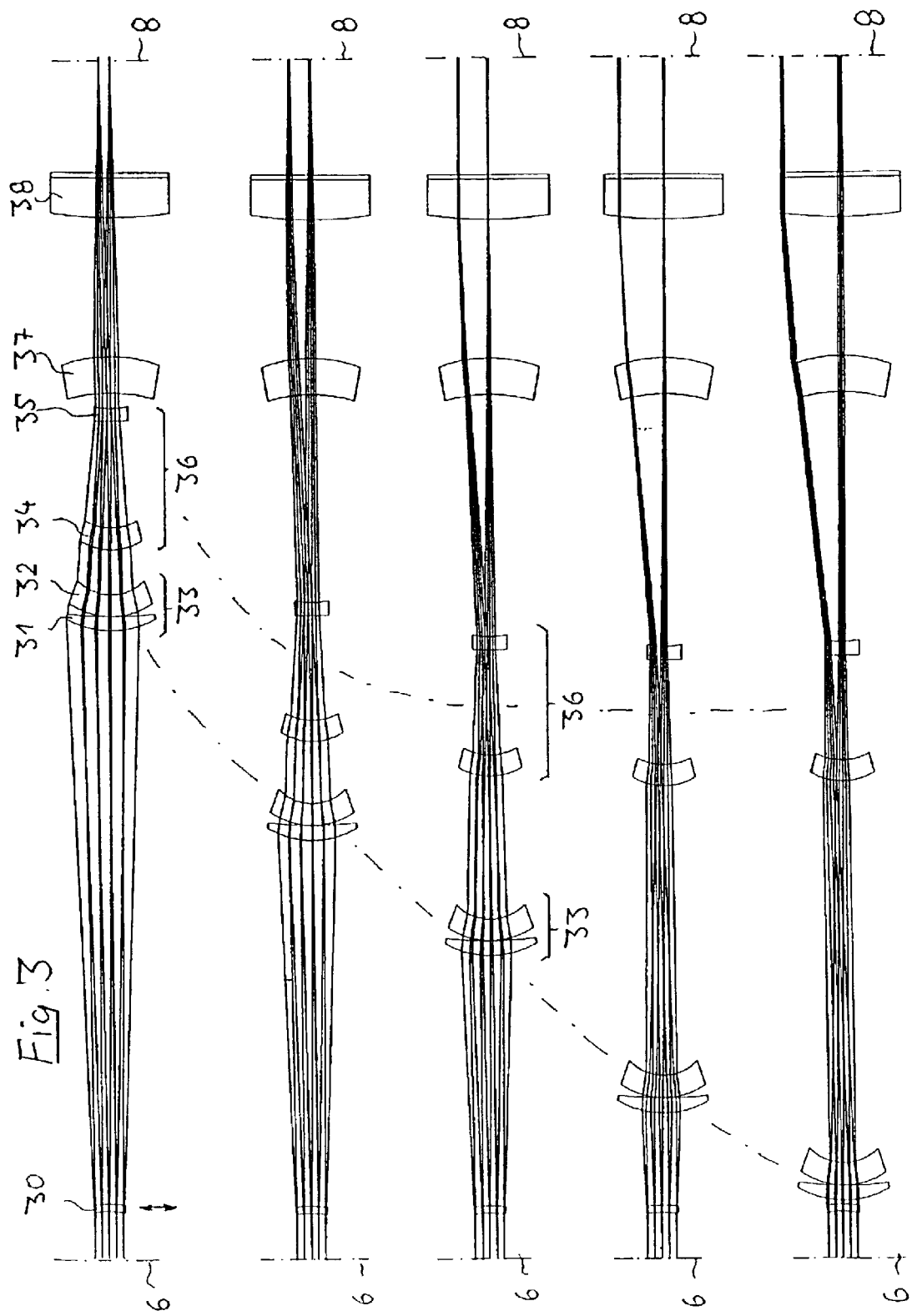

ZOOM SYSTEM FOR AN ILLUMINATION DEVICE

The following disclosure is based on German Patent Application DE 101 44 243.2 filed on Sep. 5, 2001, which is incorporated into this application by reference.

BACKGROUND OF THE INVENTION

1. Field of the Invention

The invention relates to a zoom system for an illumination device, in particular, an illumination device of a microlithographic projection exposure system.

2. Description of the Related Art

One purpose of illumination devices employed on microlithographic projection exposure systems is to uniformly illuminate a reticle arranged in the object plane of a projection lens that follows the reticle in the optical train in a manner that has been adapted to accurately suit the optical properties of the projection lens. The illumination should be telecentric in order that the directed foci of all points in the plane of the reticle will be as accurately centered on the projection lens' entrance pupil as possible. In addition, it may be desirable to provide a partially coherent illumination for which the extent to which that entrance pupil is filled will be variable and adjustable. Zoom systems are usually employed for varying the degree of coherence of the illumination. In order to allow reaching a close approximation to the limits of resolution of the optical projection during the photolithographic micropatterning process, the illumination is frequently optimized to suit the patterns on the individual layouts by creating various illumination modes, for example, annular illumination or quadrupole illumination. Devices, such as conical or pyramidal axicons, for that purpose may be incorporated into zoom systems, since there is a demand for high illumination efficiency allowing utilizing the light outputs of the light sources employed for fabricating microdevices with the least possible light losses.

Illumination devices that meet that demand are disclosed in, for example, European Patent EP 0 747 772, German Patent DE 44 21 053, or European Patent EP 0 687 956. In the case of the illumination system of European Patent EP 0 747 772, the zoom system has a plurality of lenses that are arranged along an optical axis and define an object plane and an image plane that is a Fourier transform of the object plane. Two of its lenses are movable lenses that are movable or repositionable along the optical axis when setting zooming positions of the zoom system in order to vary the size of an illuminated area in the image plane. Graticular, diffractive, optical elements bearing two-dimensional, graticular patterns are arranged in both the object plane and the exit pupil of the zoom lens. This arrangement serves to increase the light guidance factor in a suitable manner, where that graticular optical element that is arranged in the object plane, together with the zoom system, introduces a small portion of the light guidance factor and that graticular optical element that is arranged in the image plane generates the major share of the light guidance factor and adapts the illumination to suit the size and shape of the illuminated field, for example, the rectangular entrance aperture of a rod-shaped light integrator that follows it in the optical train. The graticular elements may also be called raster elements or rastered elements. The zoom system has a zoom ratio (expansion factor) of three, where partially coherent illumination having degrees of coherence ranging from 0.3 to 0.9 may be set.

A zoom system for an illumination device of a microlithographic projection system, where the zoom system has a zoom ratio of four and allows setting degrees of coherence ranging from 0.1 to 0.4 is known from U.S. Pat. No. 5,379,090.

Employment of a zoom system on the illumination device of a wafer steppers in order to allow adjusting the degree of coherence of the illumination with low light losses is known from U.S. Pat. No. 5,237,367.

An afocal zoom system for providing illumination on wafer steppers that also allows adjusting the degree of coherence of the illumination with low light losses is known from U.S. Pat. No. 5,245,384.

An illumination system for a microlithographic projection system that allows selecting various illumination settings without employing a zoom system is known from European Patent EP 1 109 067, which corresponds to U.S. patent application 2001 001247 A1. The intensity distribution of the light beam at a pupillary plane of the illumination system is determined by a train of optical elements, at least one of which is interchangeable with another optical element using an interchanging device. These interchangeable optical elements may be formed from diffractive optical elements (DOE), microlens arrays, or holographic optical elements that individually define differing illumination settings. The devices required for interchanging those optical elements must be rapid-acting and operate with high precisions, which means that extremely elaborate mechanisms and control systems are required for implementing this sort of concept.

In many applications, in particular, applications in the field of microlithographic fabrication of semiconductor devices and other types of microdevices, it is desirable to be able to switch between various illumination settings without having to interchange any optical elements. In addition, it is frequently desirable to be able to select widely differing conventional illumination settings. A demand that is becoming increasingly important, particularly at short wavelengths, for example, 193 nm, 157 nm, or shorter wavelengths, is reducing the total number of optical surfaces in the system to a minimum in order to keep transmission losses within reasonable bounds. Furthermore, a telecentricity of the exit end (image end) of the zoom system may be beneficial in order to allow adapting it to suit the optical systems that follow it in the optical train, particularly in the case of illumination systems on which exclusively angle-maintaining optical elements, such as rod-shaped light integrators, are arranged following their zoom system.

SUMMARY OF THE INVENTION

One object of the invention is to provide a zoom system for an illumination device that will allow setting a wide range of adjustable degrees of coherence without need for interchanging optical components. It is another object to provide a zoom system providing a highly uniform energy distribution at its exit end, combined with narrow edge widths and high transmission, due to the telecentricity of its exit end.

As a solution to these and other objects, this invention, according to one formulation, provides a zoom system for an illumination device having a plurality of lenses that are arranged along an optical axis and define an object plane and an image plane, wherein at least one of those lenses is a movable lens that is movable along the optical axis in order to allow varying the size of an illuminated area lying in the image plane, wherein a ratio (expansion factor), D, of a maximum size of the illuminated area lying in the image plane to a minimum size of that area is greater than four.

Beneficial embodiments are stated in the dependent claims. The wording of all claims is herewith made an integral part of this description by reference.

A zoom system according to the invention has a plurality of lenses that are arranged along an optical axis and define an object plane and an image plane. At least one of the lenses is a movable or repositionable lens that may be moved or repositioned along the optical axis in order to vary the size of an illuminated area lying in the image plane. A ratio, D, of a maximum size of that illuminated area to a minimum size thereof exceeds four. This ratio, D, will hereinafter also be referred to as the zoom system's "expansion ratio" or "expansion factor" and may, in the case of, for example, a nearly circular illuminated area, be computed by taking the ratio of the maximum radius of that area to its associated minimum radius. Even expansion factors of five and more are possible in the case of particularly beneficial embodiments of the invention. The zoom system is preferably designed to be a focal-length zooming system for which the image plane is a Fourier transform of its object plane. Preferred embodiments of the invention have no intermediate plane between their object plane and image plane.

In principle, the optical function of a single lens may also be provided by a combination of several lenses, i.e., a lens group, or by an additional, aspherical, optical surface. In general, the term "lens," as employed in this patent application, may thus also refer to a "lens group."

Zoom systems in accordance with the invention allow achieving widely varying degrees of coherence, $\sigma$, of the light supplied by illumination systems due to their designs alone, where moving lenses of the zoom system allows switching, preferably continuously, between virtually totally coherent radiation (low values of $\sigma$) and virtually totally incoherent radiation (high values of $\sigma$), where the end points of the accessible range of $\sigma$ may be altered by varying the divergence angle of the radiation incident on the zoom system. That divergence angle may be set by employing, for example, optical means, for example, a graticular, diffractive, optical element, for creating a desired angular luminous-intensity distribution from incident, collimated, light that precede the zoom system in the optical train. Since the zoom system itself covers a wide range of expansion ratios, or a wide range of $\sigma$'s, in most applications, a single angular luminous-intensity distribution at its entrance end may be employed for all illumination settings. No interchangeable graticular optical elements or similar will then be required, which greatly simplifies the overall layout of illumination devices.

In the case of preferred embodiments of the invention, the high expansion ratios provided by the invention demand that a maximum moving range of at least one of the movable lenses be more than about 35%, i.e., more than about one-third, of the overall length of the zoom system. In conjunction with this patent application, the term "overall length" shall be defined as the axial distance between object plane and image plane. In the case of preferred embodiments of the invention, this overall length is fixed and independent of the zoom setting selected, which will simplify incorporating zoom systems of that type into devices, for example, an illumination device of a wafer stepper, in cases where the space available for their incorporation is limited. At least one of the movable lenses is preferably even movable over a moving range that is at least about 45% of the overall length of the zoom system, where knowledge of the fact that a large expansion of the size of the image is achievable by employing large moving ranges has been utilized.

In order to keep the overall length of the entire system short, and, in particular, largely unchanged compared to those of earlier systems, in spite of the large moving ranges, preferred embodiments have fixed lenses arranged in the vicinity of their object plane and, with some restrictions, in the vicinity of their image plane as well. A distance between the object plane and the optical element of the zoom system that is closest to the object plane may, preferably, be less than 15%, in particular, even less than 5%, of the overall length of the zoom system, which will also allow a moving range of at least one movable lens to terminate at a distance from the object plane that is less than 15%, in particular, less than 5%, of the overall length of the zoom system. On the image end of the zoom system, the moving range of at least one movable lens may terminate at a distance from the image plane that is less than 50%, in particular, less than 35%, of the overall length of the zoom lens, which will allow devising a zoom system having optics that may be employed for making both angular corrections and spatial corrections, regardless of the zoom setting, i.e., of the axial positions of movable lenses.

In order to allow large moving ranges while employing the least possible total number of lenses, it will be preferable to minimize the total number of fixed lenses. In the case of preferred embodiments, the total number of movable lenses is equal to, or greater than, the total number of fixed lenses. For example, three fixed lenses and four movable lenses may be provided. Employing movable lenses that encompass at least one lens group consisting of two or more jointly movable lenses has proven favorable. Every such movable lens group preferably consists of at least two singlet lenses, which will simplify correcting beam paths and reduce angles of incidence. A maximum of two movable lenses or lens groups should preferably be employed in order to keep the mechanical designs of the components required for moving lenses simple. In order to obtain a large expansion ratio, in spite of the small number of movable lenses or lens groups, a first movable lens or lens groups and at least a second movable lens or lens group that are movable along differing moving curves when switching between differing zooming positions may be provided, which may be achieved by, for example, employing independent drives or a suitable non-linear coupling.

Preferred embodiments have at least one optical component having at least one aspherical surface arranged between the object plane and image plane. It will be particularly beneficial if at least one aspherical surface is arranged on a movable optical element, which will allow varying the corrective effect of the aspherical element over a broad range whenever necessary. Under some circumstances, employing aspherical optical elements may allow minimizing the total number of system surfaces required. Having a small number of system surfaces is particularly favorable at short operating wavelengths, such as 193 nm, 157 nm, or 126 nm, since the transmission losses in the optical materials, such as calcium fluoride, that are available increase with decreasing wavelength due to increasing absorption and the effectiveness of optical coatings decreases with decreasing wavelength, while degradation effects increase at shorter wavelengths. Preferred systems have no more than eight lenses, and preferably have just seven or fewer lenses. Arranging at least one aspherical surface in the zoom system also provides benefits in terms of better system performance in that the figure(s) of the aspherical surface(s) may be used to improve, e.g., the uniformity of the (top-head) intensity distribution over the illuminated area, the steepness of the falloff in intensity at the edges of the illuminated area, and the image-end telecentricity of the zoom system.

The foregoing and other characteristics will be apparent, both from the claims and from the description and the drawings, where the individual characteristics involved may represent characteristics that are patentable alone or several such in the form of combinations of subsets thereof that appear in an embodiment of the invention and may be implemented in other fields, as well as beneficial embodiments that may themselves be patentable.

BRIEF DESCRIPTION OF THE DRAWINGS

FIG. 2 shows sections through the lenses of a first embodiment of a zoom system in accordance with the invention for five zooming positions, where the zoom system has a movable lens having an aspherical surface; and FIG. 3 shows sections through the lenses of a second embodiment of a zoom system in accordance with the invention for five zooming positions, where the zoom system has no aspherical surfaces.

DETAILED DESCRIPTION OF THE PREFERRED EMBODIMENTS

Figure 1:
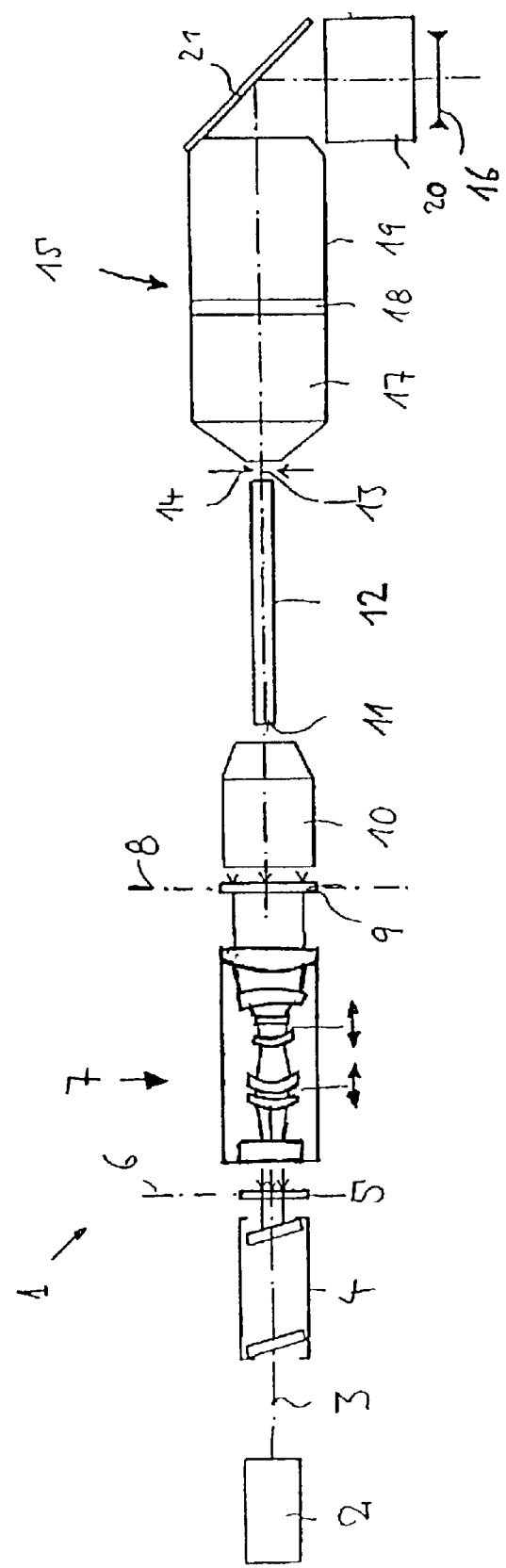
FIG. 1 is a schematized overview of an embodiment of an illumination device for a microlithographic projection device equipped with an embodiment of a zoom system in accordance with the invention.

FIG. 1 depicts an example of a microlithographic projection exposure system 1 that is employable for fabricating semiconductor devices and other types of microdevices and operates with light from the deep-ultraviolet spectral region in order to allow achieving spatial resolutions down to fractions of a micrometer. An $F_2$ excimer laser having an operating wavelength of about 157 nm whose light beam is coaxial with the optical axis 3 of its illumination system serves as its light source 2. Other UV light sources, for example, ArF excimer lasers operating at a wavelength of 193 nm, KrF excimer lasers operating at a wavelength of 248 nm, or mercury-vapor lamps having operating wavelengths of 368 nm or 436 nm, may also be employed. The light from the light source 2 is initially incident on a beam expander 4, which may, for example, be an arrangement of mirrors in accordance with German Patent DE 41 24 311, and serves to reduce the coherence and increase the cross-section of its beam to, e.g., y=35 mm±10 mm and x=10 mm±5 mm. In the case of the embodiment shown, an optional shutter that would otherwise be provided is replaced by a pulse controller for the laser 2.

A first graticular, diffractive, optical element (raster element) 5 is arranged in the object plane 6 of a zoom lens 7 arranged in the beam path, in whose image plane 8 or exit pupil a second graticular, diffractive, optical element (raster element) 9 is arranged.

Input-coupling optics 10 arranged following the latter in the optical train transmit the light to the entrance surface 11 of a rod-shaped light integrator 12 fabricated from calcium fluoride that mixes and homogenizes light passing through it via multiple internal reflections. An intermediate field plane in which a reticle/masking system (REMA) 14 that serves as an adjustable field stop is arranged lies directly on the exit surface 13 of the rod 12. The lens 15 that follows the latter in the optical train images the intermediate field plane and masking system 14 onto reticle 16 (a mask or photolithographic layout) and contains a first lens group 17, an intermediate pupillary plane 18 into which filters or stops may be inserted, a second lens group and a third lens group 19 and 20, respectively, and, between them, a deflecting mirror 21 that allows incorporating the long (approximately 3 m long) illumination device with its axis horizontal and mounting the reticle 16 with its plane aligned on the horizontal axis.

Together with a projection lens (not shown) and an adjustable wafer holder that clamps the reticle 16 in the object plane of the projection lens, this illumination system forms a projection exposure system for the microlithographic fabrication of electronic circuit components, as well as diffractive optical elements and other types of microdevices.

In the case of a wafer stepper, the entire patterned surface, in general, a rectangle having an arbitrary aspect ratio ranging from, for example, 1:1 to 1:2, in particular, 1:1.3, corresponding to a microchip on the reticle 16 is illuminated as uniformly and as sharp-edged as possible.

In the case of a wafer scanner, a narrow strip, typically a rectangle having an aspect ratio ranging from 1:2 to 1:8, on the reticle is illuminated and the illuminated area sequentially scanned over the entire patterned field of a microchip. Here, once again, the illumination should be arranged such that it is extremely uniform and sharp-edged along the direction orthogonal to the scanning direction.

In many cases, the illuminated area on the reticle 16 may also have other shapes. The numerical aperture of the reticle/masking system 14 and the cross-sectional area of the rod 12 should be accurately adapted to suit the required shape.

The embodiments of the components, in particular, the graticular optical elements 5 and 9, preceding the rod-shaped light integrator 12 in the optical train should be chosen such that the rod's entrance surface 11 will be largely uniformly illuminated with the greatest possible efficiency, i.e., with no significant light losses due to spillage over the edges of its entrance surface. To that end, the profile of the collimated light beam from the beam expander 4, which has a rectangular cross-section and a non-axisymmetric divergence profile, is initially altered by the first graticular, diffractive, optical element 5 while increasing light guidance factor by reducing its divergence and cross-sectional area. In particular, the first graticular, diffractive, optical element 5 has numerous hexagonal cells that generate a hexagonal angular luminous-intensity distribution. The numerical aperture, NA, of the first graticular, diffractive, optical element is, for example, NA=0.027, which introduces around 10% of the total light guidance factor. Together with the zoom optics 7, the graticular, diffractive, optical element 5 arranged in the front focal plane of the zoom optics 7 prepares a variable, secondary, light source (the first pupillary plane of the illumination system), in the rear focal plane, or image plane 6, of the zoom system, where the second graticular optical element 9, which is configured as a refractive optical element generating a rectangular beam profile, is arranged. This latter element generates the bulk of the light guidance factor and adapts the light guidance factor to the field size, i.e., to the cross-sectional area of the rectangular entrance surface 11 of the rod-shaped light integrator 12, via the input-coupling optics 10.

Except for the zoom lens 7, the layout of the illumination system may, for example, agree with that described in European Patent EP 0 747 772, whose complete disclosure is incorporated herein by reference and herewith made an integral part of the present description by reference.

The layout, mode of operation, and special features of the zoom system 7 will be discussed below, where FIG. 2 depicts an embodiment having an aspherical surface on a movable lens, while all lens surfaces of the embodiment depicted in FIG. 3 are spherical. Due to the similar layout of these embodiments, their corresponding elements have been assigned identical reference numbers for greater clarity.

The zoom systems of both embodiments are configured as focal-length zooming lenses having no intermediate images, where their object plane 6 and image plane 8 are Fourier-transformed planes having no intermediate image planes between them.

The zoom system depicted in FIG. 2 has a fixed overall length (distance between its object plane and image plane) of about 1,020 mm. A first meniscus lens 30 having an entrance surface F2 curved away from the object plane 6 is arranged within a short working distance of about 40 mm from the field plane 6, where that lens 30 has a negative refractive power and slightly expands the incident light beam. That lens is followed by a second meniscus lens 31 that has a positive refractive power, an entrance surface F4 that is curved away from the object plane, an exit surface F5 having a slight curvature in that same direction, and is separated from the first lens 30 by a variable air space. That lens is followed at a fixed distance of just 0.06 mm by a third meniscus lens 32 that has a positive refractive power, an aspherical entrance surface F6 that is curved toward the object plane, and a spherical exit surface F7 that is also curved toward the object plane. The second lens 31 and third lens 32 are jointly axially movable and form a first movable lens group 33. The third lens is followed by a fourth meniscus lens 34 that has a positive refractive power, an aspherical entrance surface F8 that is curved toward the object plane, an exit surface F9 that is also curved toward the object plane, and is separated from the third lens 32 by a variable air space. The fourth lens is followed by a fifth lens 35 that has a negative refractive power, a nearly planar entrance surface F10 a concave exit surface F11, and is separated from the fourth lens 34 by a fixed air space. The fourth lens 34 and fifth lens 35 are jointly axially movable and form the second movable lens group 36 of the zoom system. That lens group is followed in the optical train by a permanently mounted sixth lens 37 that is figured as a meniscus lens with a negative refractive power and has an entrance surface F12 that is curved toward the image plane and an exit surface F13 that is also curved toward the image plane. That lens is followed by a seventh lens 38 that is also permanently mounted, has a positive refractive power, an entrance surface F14 that is curved toward the object plane, a planar exit surface F15, and is separated from the sixth lens 37 by a fixed air space. This latter lens is mounted at a fixed distance of about 120 mm from the image plane 8.

The radii of curvature, r [mm], of the lens surfaces, the respective thicknesses of the lenses, d [mm], and the half-maximum beam diameters, $h_{max}$ [mm], that occur at the surfaces, F, of the lenses and correspond to the optically utilized radii are listed in Table 1. Table 2 lists the aspherical constants of the aspherical surface F6 of the zoom system in the usual notation. Table 3 lists the axial lengths [mm] of the variable air-spaces that follow lens surfaces F3, F7, and F11 for five different zooming positions (Zoom Pos. 1 through Zoom Pos. 5, proceeding from top to bottom in FIG. 2). All lenses are fabricated from $CaF_2$, which has a nominal refractive index, n, of n=1.558 at the operating wavelength of 157.63 nm.

The functions and other special features of the zoom system will be discussed below. The object plane (field plane 6) is illuminated by a luminous-intensity distribution having a rectangular profile and dimensions of about 20 mm×15 mm. The first graticular, diffractive, optical element 5 arranged in the object plane creates an angular irradiance distribution in the object plane that has a hexagonal shape in angle space. The mean numerical aperture here is 25 mrad. This light passes through the lenses of the zoom system and creates a hexagonal illuminated area in the image plane 8, where the size of that illuminated area is continuously variable by varying the positions of the pair of movable lens groups 33 and 36. In the case of this embodiment, the radius of the circle having the same area as this hexagon is variable over a range extending from a minimum of 10 mm (zooming position 1, appearing at the top of FIG. 3) to a maximum of about 50 mm (zooming position 5, appearing at the bottom of FIG. 3), which corresponds to an expansion factor, or expansion ratio, of 5.0. The minimum illuminated area in the image plane is less than the area of the object field and its maximum area exceeds the latter. The energy density in the image plane 8 varies by about 5% or less for each zooming position, except at the edges of the luminous-intensity distribution. The directions of the principal rays in the image plane differ from the direction of the optical axis 3 by at most 1 mrad for any zooming position in order that the telecentricity of the zoom system's image end will be maintained for any zooming position. Light rays in the image plane have a numerical aperture of less than about 0.055 for any zooming position. The exact location of the image plane, which varies with zooming position, has little effect on the luminous-intensity distribution in the real, fixed, image plane. The exact angular luminous-intensity distribution within such a low-numerical-aperture light ray has only a very slight effect on imaging performance.

It may be seen that the large expansion ratio, D, of a factor of five is promoted by the fact that a substantial amount of space (about 70% of the zoom system's overall length) is available for axially moving the pair of independently movable lens groups 33 and 36 between the first lens 30 on the zoom system's entrance end and the permanently mounted sixth lens 37, where the position of the first lens group 33 may be shifted over a maximum length of travel of about 500 mm, which corresponds to more than ⅓, or nearly exactly half of the overall length of the zoom lens, between its position closest to the object (zooming position 5, which corresponds to an illuminated area in the image plane having the maximum radius) and its position closest to the image (zooming position 1, which corresponds to an illuminated area in the image plane having the minimum radius). The maximum length of travel of the second movable lens group 36 between its position closest to the object (zooming position 4) and its position closest to the image (zooming position 1) is about 225 mm, or more than 20% of the overall length of the zoom lens. No fixed lenses are situated between the movable lenses. The first lens group may thus be at a zooming position that is at a location that will be occupied by the second lens group for another zooming position. There are thus no restrictions on their lengths of travel. Moreover, the minimum distance between the movable lens groups at least equals the minimum image diameter in order that collisions due to overshooting at high accelerations will be precluded. From FIG. 2, it may be seen that there is no simple, linear, relationship between the moving curves of the movable lens groups 33 and 36 and that the movable lens groups are moved along nonlinear curves (dotted lines), even in the case of the linear image-size variations shown. In the case of the embodiment described, each of these lens groups 33 and 36 has an independently controllable drive for handling these axial motions.

In the case of the movable lens group 33 and the fixed lenses 37 and 38, their illuminated area varies widely over the various zooming positions, where the diameter of their illuminated area preferably ranges from about 60% to about 100% of the diameter of the lens involved. Sections near their axis may be utilized for correction purposes for zooming positions yielding small-diameter images, while sections near their edges may be utilized for that purpose for zooming positions yielding large-diameter images. Although the energetic loadings of the lenses differ for differing zooming positions, this presents no problems to the relatively large lenses involved.

Yet another special feature of the system shown in FIG. 2 is that it includes an aspherical surface (entrance surface F6 in on its third lens 32) that is also axially movable over an extended range. Since lenses may be repositioned from the vicinity of the object plane (zooming position 5) to locations relatively close to the vicinity of the image plane, there are optical means that are independent of the zooming position involved and may be utilized for making both angular corrections and spatial corrections. If, as in the case of the sample embodiment depicted in FIG. 2, at least one of the movable elements is provided with at least one aspherical surface, the number of degrees of freedom will be further increased.

This zoom system is also characterized by an extremely favorable, "lax" or "relaxed" beam guidance, which, among other reasons, will be evident from the fact that the maximum angle of incidence i of radiation striking an optical surface of the zoom system is 44° (sin i<0.69) or less for any zooming position. "Angle of incidence" is here defined as the angle between the direction of incidence of a light beam and the local normal to an optical surface at the point of incidence. These low angles of incidence are favorable for avoiding imaging errors and, most importantly, allow effectively anti-reflection coating the optical surfaces of its lenses using suitable anti-reflection coatings, which will increase the transmittance of the entire system and allow reducing stray-light levels. This lax beam guidance is favored by a special distribution of refractive power. An axially fixed negative refractive power on the zoom system's entrance end is followed by, firstly, a positive refractive power, which is then followed by a movable negative refractive power. Fixed positive refractive power is provided on its exit end.

The invention also encompasses a method for affecting the luminous-intensity distribution in the image plane 8 without altering the positions of the zoom system's lenses. It has been found that tilting and/or decentering the luminous-intensity distribution of the laser at the zoom system's entrance end may be utilized for setting a constant image displacement and a constant angular tilt of the luminous-intensity distribution in the image plane of the zoom system, regardless of the zooming position involved. Defined as "tilting" here is an angular displacement of the direction of the laser beam relative to the optical axis of the illumination system. "Decentering" of the luminous-intensity distribution at the zoom system's entrance end is defined as shifting this luminous-intensity distribution orthogonally to the optical axis.

Manipulating or adjusting the convergence/divergence of laser radiation entering the illumination device will also, or additionally, allow altering the axial location (position along the z-axis) of the image plane 8 for a given zooming position. The manipulation of the location of the image plane 8 along the z-axis by varying the convergence/divergence of the incident laser beam proposed here may be utilized for adjusting or setting the axial location of the image plane 8 of the zoom system. The convergence/divergence of laser radiation incident on the zoom system may be varied by, for example, inserting and/or moving optical elements in the beam path ahead of the zoom system by, for example, inserting and/or moving lenses and/or manipulating the beam divergence using the beam expander 4, which will allow providing that the principal rays of the laser radiation will no longer be essentially parallel to one another and will then be angularly displaced with respect to one another, which, in turn, will shift the location of a nearly point-like light source from infinity to a finite distance. This introduction of convergence/divergence is to be distinguished from introduction of a stop using a DOE or similar, which would introduce a stop or angular luminous-intensity distribution for given, locally unaltered, principal rays. This method is useful for, for example, coordinating the locations of the image planes 8 of the various zooming positions of installed zoom lenses to one another without making any structural changes to the zoom system. For example, varying the directions of the principal rays of the incident laser beam by 0.1 mrad for a given zooming position will axially displace the image plane 8 by about 10 mm (for zooming position 1) and as much as 500 mm (for zooming position 5), which correspond to variation ranges of about 1% and 50%, respectively, of the overall length of the zoom system. The location of the image plane associated with the zooming position yielding the largest illuminated area may thus be varied, virtually independently of the location of the image plane yielding the minimum illuminated area.

This method may also be utilized on other illumination devices, regardless of the type of zoom system involved.

The first lens 30 is mounted such that it may be repositioned along mutually orthogonal axes orthogonal to the optical axis 3. The design of the zoom system is such that, to a first approximation, decentering this first lens off the optical axis will yield merely an offset of the image field. Typical decenterings might range from fractions of a millimeter to several millimeters. This decentering may be utilized for reducing, or fully compensating for, offsetting of the image field, due to, for example, tolerances in the optical elements and their mountings.

The second embodiment of a zoom system 7 depicted in FIG. 3 has essentially the same layout as the first embodiment depicted in FIG. 2 described above. The major difference here is that, in the case of the second embodiment, all lens surfaces have spherical figures, which simplifies fabrication of its lenses. In the case of this particular example, this zoom system will be employed in combination with a diffractive optical element having a mean numerical aperture of 25 mrad inserted into the object plane 6. The overall length of the zoom system is 1,050 mm. Its other parameters, in particular, the lens material employed, the operating wavelength, the expansion ratio, the minimum and maximum radii of the illuminatable area, the maximum moving ranges of its first lens group and second lens group, energy-density variations over its image plane, the telecentricity of its image end, etc., all agree with those of the sample embodiment depicted in FIG. 2, which has been described in detail above. The radii of curvature, r, of the surfaces of its lenses, their thicknesses, d, and the half-maximum beam diameters, $h_{max}$, involved are listed in Table 4. Table 5 lists the axial lengths of the variable air-spaces that follow lens surfaces F3, F7, and F11 for five different zooming positions (Zoom Pos. 1 through Zoom Pos. 5, proceeding from top to bottom in FIG. 3). This sample embodiment proves that the benefits of the invention may also be fully exploited in the case of zoom systems incorporating exclusively simple-to-fabricate spherical lenses.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| Surface No. | Radius, r [mm] | Thickness, d [mm] | Semi-Diameter, $h_{max}$ [mm] |
|---|---|---|---|
| F1 | 0.0 | 40.01 | 16.50 |
| F2 | −104.82 | 3.89 | 17.54 |
| F3 | −163.95 | 3.00 | 17.88 |
| F4 | 110.88 | 14.97 | 48.72 |
| F5 | 496.91 | 0.06 | 47.91 |
| F6 | 65.17 | 25.83 | 45 45 |
| F7 | 48.29 | 307.73 | 35 93 |
| F8 | 55.54 | 7.08 | 33.01 |
| F9 | 74.80 | 71.24 | 32.00 |
| F10 | −8145.54 | 10.32 | 18.76 |
| F11 | 51.97 | 242.03 | 17.04 |
| F12 | −131.57 | 34.67 | 40.74 |
| F13 | −127.16 | 120.04 | 46.80 |
| F14 | 380.10 | 38.60 | 57.03 |
| F15 | 0.00 | 100.12 | 56.85 |

TABLE 2

| Surface No. | Conicity Constant, k | C1 | C2 | C3 | C4 |
|---|---|---|---|---|---|
| F6 | 0.47416 | −2.12695 e−07 | −2.284472 e−010 | 1.328999 e−13 | −5.565044 e−17 |

TABLE 3

| Surface No. | Zoom Pos. 1 | Zoom Pos. 2 | Zoom Pos. 3 | Zoom Pos. 4 | Zoom Pos. 5 |
|---|---|---|---|---|---|
| F3 | 500.89 | 306.20 | 171.60 | 69.83 | 3.00 |
| F7 | 42.01 | 46.25 | 140.00 | 238.88 | 307.73 |
| F11 | 10.86 | 200.30 | 241.15 | 244.05 | 242.03 |

TABLE 4

| Surface No. | Radius, r [mm] | Thickness, d [mm] | Semi-Diameter, $h_{max}$ [mm] |
|---|---|---|---|
| F1 | 0.0 | 40.07 | 12.50 |
| F2 | −79.15 | 5.97 | 13.47 |
| F3 | −109.96 | 3.04 | 13.96 |
| F4 | 79.41 | 12.74 | 39.40 |
| F5 | 347.11 | 0.09 | 38.66 |
| F6 | 63.66 | 19.36 | 36.74 |
| F7 | 41.08 | 329.97 | 29.39 |
| F8 | 50.77 | 19.11 | 27.23 |
| F9 | 46.51 | 93.30 | 22.84 |
| F10 | 9068.70 | 11.63 | 14.84 |
| F11 | 81.50 | 220.34 | 14.86 |
| F12 | −134.14 | 31.52 | 38.03 |
| F13 | −124.17 | 120.00 | 43.13 |
| F14 | 391.31 | 38.60 | 52.17 |
| F15 | 0.00 | 100.21 | 52.02 |

TABLE 5

| Surface No. | Zoom Pos. 1 | Zoom Pos. 2 | Zoom Pos. 3 | Zoom Pos. 4 | Zoom Pos. 5 |
|---|---|---|---|---|---|
| F3 | 499.97 | 316.29 | 215.22 | 79.01 | 3.04 |
| F7 | 40.01 | 54.26 | 124.45 | 251.43 | 329.97 |
| F11 | 13.36 | 182.80 | 213.68 | 222.91 | 220.34 |

What is claimed is:

1. A zoom system for an illumination device comprising:
a plurality of lenses that are arranged along an optical axis and define a front focal plane and a rear focal plane, wherein the rear focal plane is a Fourier transform of the front focal plane,
wherein at least one of the lenses is a lens that is movable along the optical axis in order to allow varying the size of an illuminated area lying in the rear focal plane, and
wherein a ratio of a maximum size of the illuminated area lying in the rear focal plane to a minimum size of that area is greater than four.

2. A zoom system according to claim 1, wherein the ratio is greater than, or equal to, five.

3. A zoom system according to claim 1, wherein the zoom system has no intermediate image plane.

4. A zoom system according to claim 1, wherein a maximum moving range of at least one of the movable lenses is greater than about 35% of the overall length of the zoom system.

5. A zoom system according to claim 1, wherein at least one of the movable lenses has a maximum moving range that is at least about 45% of the overall length of the zoom system.

6. A zoom system according to claim 1, wherein at least one optical element is arranged in the vicinity of the front focal plane, where a distance between the front focal plane and the at least one optical element is less than 15% of the overall length of the zoom system.

7. A zoom system according to claim 1, wherein a moving range for at least one of the movable lenses terminates at a distance from the front focal plane that is less than 15% of the overall length of the zoom system.

8. A zoom system according to claim 1, wherein a moving range for at least one of the movable lenses terminates at a distance from the rear focal plane that is less than 50% of the overall length of the zoom system.

9. A zoom system according to claim 1, wherein the zoom system has axially fixed lenses and axially movable lenses, and wherein the total number of movable lenses is equal to, or greater than, the total number of fixed lenses.

10. A zoom system according to claim 1, wherein the movable lenses include at least one lens group having two or more jointly movable lenses.

11. A zoom system according to claim 1, comprising no more than two movable lenses, wherein each of the movable lenses is a movable lens group that comprises at least two singlet lenses.

12. A zoom system according to claim 1, wherein each of the movable lenses is a movable lens group that comprises at least two singlet lenses.

13. A zoom system according to claim 1, wherein no fixed lenses are situated between the movable lenses.

14. A zoom system according to claim 1, wherein a minimum distance between the movable lenses is at least as large as the minimum image diameter.

15. A zoom system according to claim 1, comprising a first movable lens as the movable lens and at least a second movable lens, said first and second movable lenses being movable along differing moving curves when switching between differing zoom positions.

16. A zoom system according to claim 1, wherein at least one optical component having at least one aspherical surface is arranged between the front focal plane and the rear focal plane.

17. A zoom system according to claim 1, wherein at least one optical component having at least one aspherical surface that is arranged between the front focal plane and the rear focal plane is one of arranged and arrangable in the vicinity of the front focal plane.

18. A zoom system according to claim 1, wherein at least one movable optical component having at least one aspherical surface is arranged between the front focal plane and the rear focal plane.

19. A zoom system according to claim 1, wherein an image end of the zoom system is telecentric.

20. A zoom system according to claim 1, wherein the zoom system operates largely without vignetting.

21. A zoom system according to claim 1, wherein the light beam in the rear focal plane has a numerical aperture that is less than 0.055 for any zoom position.

22. A zoom system according to claim 1, wherein fewer than 16 optical surfaces are provided between the front focal plane and the rear focal plane.

23. A zoom system according to claim 1, wherein a maximum angle of incidence for radiation incident on an optical surface is less than 50°.

24. A zoom system according to claim 1, wherein a fixed negative refractive power and a movable positive refractive power are followed by a movable negative refractive power, which, in turn, is followed by a fixed positive refractive power.

25. A zoom system according to claim 1, comprising at least one of at least one movable lens group as said movable lens and at least one fixed lens group whose illuminated area varies widely such that the diameter of the illuminated area varies between about 60% and 100% of the diameter of the lens involved.

26. A zoom system according to claim 1, wherein at least one of the lenses is mounted such that it is transversely decentered with respect to the optical axis of the zoom system.

27. A zoom system according to claim 1, further comprising means for adjusting the axial positions of the rear focal plane along the optical axis.

28. A zoom system according to claim 27, wherein the means of adjusting includes at least one device for altering the convergence/divergence of radiation from a light source.

29. A zoom system according to claim 1, wherein the zoom system operates largely without vignetting.

30. An illumination system for a microlithographic projection exposure system equipped with a zoom system for varying the coherence of the illumination supplied by the illumination system, the zoom system comprising:
a plurality of lenses that are arranged along an optical axis and define a front focal plane and a rear focal plane, wherein the rear focal plane is a Fourier transform of the front focal plane,
wherein at least one of the lenses is a lens that is movable along the optical axis in order to allow varying the size of an illuminated area lying in the rear focal plane, and
wherein a ratio of a maximum size of the illuminated area lying in the rear focal plane to a minimum size of that area is greater than four.

31. An illumination system for a microlithographic projection exposure system equipped with a zoom system for varying the coherence of the illumination supplied by the illumination system, the zoom system comprising a front focal plane and a rear focal plane, wherein the rear focal plane is a Fourier transform of the front focal plane; and means for adjusting the axial position of the rear focal plane, the means for adjusting comprising means for altering the convergence/divergence of radiation from a light source of the illumination system along its direction of travel, prior to its entering the zoom system,
wherein a ratio of a maximum size of the illuminated area lying in the rear focal plane to a minimum size of that area is greater than four.

32. A method for fabricating at least one of semiconductor devices and other types of microdevices, comprising:
illuminating a reticle arranged in a front focal plane of a projection lens using an illumination device that includes a zoom system comprising:
a plurality of lenses that are arranged along an optical axis and define the front focal plane and a rear focal plane, wherein the rear focal plane is a Fourier transform of the front focal plane,
wherein at least one of the lenses is a lens that is movable along the optical axis in order to allow varying the size of an illuminated area lying in the rear focal plane,
wherein an expansion factor of a maximum size of the illuminated area lying in the rear focal plane to a minimum size of that area is greater than four; and
imaging the reticle onto a photosensitive substrate,
wherein said illuminating the reticle includes altering the properties of the light beam incident on the reticle by moving at least one lens of the zoom system along the optical axis of the zoom system.

33. A zoom system for an illumination device comprising:
a plurality of lenses that are arranged along an optical axis and define a front focal plane and a rear focal plane,
wherein at least one of the lenses is a lens that is movable along the optical axis in order to allow varying the size of an illuminated area lying in the rear focal plane,
wherein a ratio of a maximum size of the illuminated area lying in the rear focal plane to a minimum size of that area is greater than four, and
wherein the zoom system has no intermediate image plane.

34. A zoom system according to claim 33, wherein the ratio is greater than, or equal to, five.

35. A zoom system according to claim 33, wherein a maximum moving range of at least one of the movable lenses is greater than about 35% of the overall length of the zoom system.

36. A zoom system according to claim 33, wherein at least one optical element is arranged in the vicinity of the front focal plane, where a distance between the front focal plane and the at least one optical element is less than 15% of the overall length of the zoom system.

37. A zoom system according to claim 33, wherein a moving range for at least one of the movable lenses terminates at a distance from the front focal plane that is less than 15% of the overall length of the zoom system.

38. A zoom system according to claim 33, wherein the zoom system has axially fixed lenses and axially movable lenses, and wherein the total number of movable lenses is equal to, or greater than, the total number of fixed lenses.

39. A zoom system according to claim 33, wherein the movable lenses include at least one lens group having two or more jointly movable lenses.

40. A zoom system according to claim 33, comprising no more than two movable lenses, wherein each of the movable lenses is a movable lens group that comprises at least two singlet lenses.

41. A zoom system according to claim 33, wherein no fixed lenses are situated between the movable lenses.

42. A zoom system according to claim 33, comprising a first movable lens as the movable lens and at least a second movable lens, said first and second movable lenses being movable along differing moving curves when switching between differing zoom positions.

43. A zoom system according to claim 33, wherein at least one optical component having at least one aspherical surface is arranged between the front focal plane and the rear focal plane.

44. A zoom system according to claim 33, wherein at least one optical component having at least one aspherical surface that is arranged between the front focal plane and the rear focal plane is one of arranged and arrangable in the vicinity of the front focal plane.

45. A zoom system according to claim 33, wherein at least one movable optical component having at least one aspherical surface is arranged between the front focal plane and the rear focal plane.

46. A zoom system according to claim 33, wherein an image end of the zoom system is telecentric.

47. A zoom system according to claim 33, wherein the light beam in the rear focal plane has a numerical aperture that is less than 0.055 for any zoom position.

48. A zoom system according to claim 33, wherein a fixed negative refractive power and a movable positive refractive power are followed by a movable negative refractive power, which, in turn, is followed by a fixed positive refractive power.

49. A zoom system according to claim 33, wherein at least one of the lenses is mounted such that it is transversely decentered with respect to the optical axis of the zoom system.

50. A zoom system according to claim 33, further comprising means for adjusting the axial positions of the rear focal plane along the optical axis, wherein the means of adjusting includes at least one device for altering the convergence/divergence of radiation from a light source.

51. A zoom system for an illumination device comprising:
a plurality of lenses that are arranged along an optical axis and define a front focal plane and a rear focal plane,
wherein at least one of the lenses is a lens that is movable along the optical axis in order to allow varying the size of an illuminated area lying in the rear focal plane,
wherein a ratio of a maximum size of the illuminated area lying in the rear focal plane to a minimum size of that area is greater than four, and
wherein the light beam in the rear focal plane has a numerical aperture that is less than 0.055 for any zoom position.

52. A zoom system according to claim 51, wherein the ratio is greater than, or equal to, five.

53. A zoom system according to claim 51, wherein the rear focal plane is a Fourier transform of the object plane.

54. A zoom system according to claim 51, wherein the zoom system has no intermediate image plane.

55. A zoom system according to claim 51, wherein an image end of the zoom system is telecentric.

56. A zoom system according to claim 51, wherein the zoom system operates largely without vignetting.

57. A zoom system for an illumination device comprising:
a plurality of lenses that are arranged along an optical axis and define a front focal plane and a rear focal plane,
wherein at least one of the lenses is a lens that is movable along the optical axis in order to allow varying the size of an illuminated area lying in the rear focal plane,
wherein a ratio of a maximum size of the illuminated area lying in the rear focal plane to a minimum size of that area is greater than four, and
wherein a fixed negative refractive power and a movable positive refractive power are followed by a movable negative refractive power, which, in turn, is followed by a fixed positive refractive power.

58. A zoom system according to claim 57, wherein the rear focal plane is a Fourier transform of the object plane.

59. A zoom system according to claim 57, wherein the zoom system has no intermediate image plane.

60. A zoom system according to claim 57, comprising no more than two movable lenses, wherein each of the movable lenses is a movable lens group that comprises at least two singlet lenses.

61. A zoom system according to claim 57, wherein at least one optical component having at least one aspherical surface is arranged between the front focal plane and the rear focal plane.

62. A zoom system according to claim 57, wherein at least one optical component having at least one aspherical surface that is arranged between the front focal plane and the rear focal plane is one of arranged and arrangable in the vicinity of the front focal plane.

63. A zoom system according to claim 57, wherein at least one movable optical component having at least one aspherical surface is arranged between the front focal plane and the rear focal plane.

64. A zoom system according to claim 57, wherein an image end of the zoom system is telecentric.

65. A zoom system according to claim 57, wherein the light beam in the rear focal plane has a numerical aperture that is less than 0.055 for any zoom position.

* * * * *